United States Patent [19]

Del Rosario

[11] Patent Number: 4,493,389

[45] Date of Patent: Jan. 15, 1985

[54] SPEAKER ASSEMBLY

[76] Inventor: Luis Del Rosario, 1363 N. Verdugo Rd., Glendale, Calif. 91208

[21] Appl. No.: 382,429

[22] Filed: May 27, 1982

[51] Int. Cl.³ .............. H05K 5/00

[52] U.S. Cl. .............. 181/152; 181/141; 381/86

[58] Field of Search .............. 181/141-156, 181/159, 199; 179/1 VE; 381/86

[56] References Cited

U.S. PATENT DOCUMENTS 4,181,193 1/1980 Isaac .............. 181/159 X 4,206,830 6/1980 Sohma et al. .............. 181/141

4,323,138 4/1982 Horner .............. 181/147

FOREIGN PATENT DOCUMENTS 1215392 4/1960 France .............. 181/141

*Primary Examiner*—Benjamin R. Fuller

*Attorney, Agent, or Firm*—Wagner & Bachand

[57] ABSTRACT

An acoustic assembly adapted to receive a loudspeaker comprising an enclosed housing having an area defining a loudspeaker port and an area defining at least one sound port, the loudspeaker port being adapted to mount the loudspeaker substantially outside of the housing in a sealed relationship to the front of the housing, the loudspeaker directing sound into the housing, and, each of the sound ports having a cross-sectional area less than the cross-sectional area of the loudspeaker port so that the pressure of the sound energy emitted at the loudspeaker becomes increased when emitted through at least one of the sound ports.

26 Claims, 12 Drawing Figures

SPEAKER ASSEMBLY

BACKGROUND OF THE INVENTION

The present invention relates to loudspeaker assemblies and particularly with loudspeaker assemblies which channel sound into relatively small enclosed areas.

The loudspeaker assemblies of the present invention are particularly suited to be mounted in the trunk area of an automobile and send the sound energy into the passenger compartment via a hole in the rear deck area of the automobile. It has been known to mount a loudspeaker on the trunk side of the rear deck of an automobile with the loudspeaker emitting sound into the passenger compartment. However, the sound emitted from this mounted loudspeaker have several disadvantages. First, there is a natural boominess to the loudspeaker. Boominess is a narrow frequency range of high resonance which causes sound in the narrow frequency range to become significantly augmented relative to the other parts of the frequency range of the loudspeaker. This boominess creates undesirable non-linearity of the sound reproduction. Second, the mounted loudspeaker, because it must be small to take up a minimum amount of room, cannot reproduce the low end of the audio spectrum with the efficiency that the middle and high ranges of the audio spectrum are reproduced. This inability to efficiently reproduce the low end of the audio spectrum also leads to non-linearity of the sound reproduction.

It has also been known to enclose a loudspeaker in a loudspeaker enclosure and mount this loudspeaker enclosure to the rear deck area, in a door panel or under the dash area of an automobile. These loudspeaker enclosures, however, must be small so as to take up a minimum amount of room in its mounted location. Thus, the loudspeaker enclosures suffer from the effects of incomplete damping of the backward wave from the loudspeaker, namely increased boominess from the compression on the loudspeaker cone. As well, these loudspeaker enclosures are also unable to efficiently reproduce the low end of the audio spectrum. This inability to efficiently reproduce the low end of the audio spectrum is caused by the fact that the loudspeaker enclosure cannot be of sufficient size to allow an increased efficiency by the recapturing of the backward going wave by the use of a tuned ports.

All of the prior loudspeaker installations in automobiles or other small enclosed spaces have used loudspeaker installations which take advantage of principles which are applicable to open air environments. It is possible, as will be described later, that the present invention has been successful in increasing the efficiency at the low end of the audio spectrum and has acted to dramatically decrease the natural boominess of the loudspeaker because, unlike the low impedance air of open air environments, the small enclosed air environments have high impedance air. If it is correct that the small enclosed air environments have high impedance air, the present invention, which acts to transform low impedance sound from the loudspeaker to high impedance sound, increases the efficiency of the reproduction of the low end of the audio spectrum because there is an impedance matching with the present invention which all previous loudspeaker designers and installers did not understand.

Even without considering the explanation of the possible reasons for the increased efficiency of the reproduction of the low end of the audio spectrum and the decreased boominess, the present loudspeaker assemblies have achieved never before achieved linearity of sound reproduction. As well, one of the present loudspeaker assemblies has achieved an outer configuration which allows it to be installed in most mass produced passenger cars without modification.

SUMMARY OF THE INVENTION

One objective of the present invention is to increase the efficiency of the reproduction of sound in the low end of the audio spectrum in small enclosed spaces such as an automobile's passenger compartment. It is another objective of the present invention to decrease the natural boominess of the loudspeaker so as to develop more linear sound reproduction from the loudspeaker over the entire audio spectrum in this same small enclosed space.

It is still another objective of the present invention to produce a loudspeaker assembly which can be installed in at least a majority of the massed produced automobiles without modification and take up a minimum amount of room.

These objectives have been accomplished by the loudspeaker assemblies of the present invention which comprise a loudspeaker and an enclosed housing having an area defining a loudspeaker port and an area defining at least one sound port, the loudspeaker port being adapted to mount the loudspeaker from outside of the housing in a sealed relationship to the housing, each of the sound ports having a cross-sectional area less than the cross-sectional area of the loudspeaker port so that the pressure of the sound energy emitted at the loudspeaker becomes increased when emitted through at least one of the sound ports.

The loudspeaker assembly may have its sound port in substantially sealed relationship to an at least partially enclosed space so that sound energy passed through the sound port enters the at least partially enclosed space. The at least partially enclosed space may be an automobile passenger compartment and the loudspeaker assembly may be mounted in an automobile compartment other than the passenger compartment, the sound port being in a sealed relationship to an inner wall of the passenger compartment so that sound energy from the loudspeaker received by the housing enters the passenger compartment from the sound port and through the inner wall of the passenger compartment. The automobile compartment other than the passenger compartment may be the automobile trunk and the inner wall of the passenger compartment may be the rear deck.

The loudspeaker assembly housing may comprise an enclosed tapered housing having two ends, one end of greatest cross-sectional area and the other end of least cross-sectional area, the end of greatest cross-sectional area having an area defining the loudspeaker port and the end of least cross-sectional area having an area defining the sound port. This enclosed tapered housing may also have three sound ports, two of which are plugged which allows the loudspeaker assembly to be mounted in three different positions and allows the loudspeaker assembly to be installed in a majority of mass produced automobiles. Also, the housing may comprise a generally rectangular box having two coplanar sidewalls separated by perpendicular connecting walls attached generally at the perimeter of the two sidewalls, the two sidewalls and the connecting walls also defining an extended hollow neck portion of generally rectangular cross section comprising the sound port.

DETAILED DESCRIPTION OF THE INVENTION

The applicant has invented a novel loudspeaker assembly which is particularly suited for use in directing sound energy into a relatively small enclosed area, typically an automobile's passenger compartment. There have been numerous car loudspeaker systems that have been previously devised but all of them have used modified versions of loudspeaker enclosures which were designed for open air or open room operation. The results from these prior loudspeaker systems has been disappointing.

The problem with these prior loudspeaker systems is that they cannot offer generally linear sound reproduction in any of the mass produced passenger cars available and still take up the minimum amount of room required for installation in a passenger car. Particularly, the prior loudspeaker systems have not been able to effectively reproduce the low frequency end of the audio spectrum with the efficiency of the high and mid range of the audio spectrum because there is insufficient room to house the open air loudspeaker enclosures which might aid in linearizing the frequency response.

Typical of the prior car loudspeaker systems would be the loudspeaker itself mounted to the rear deck from the trunk of the automobile with the sound energy from the mounted loudspeaker entering the passenger compartment via a hole in the rear deck. Many automobile manufacturers have provided such holes in the rear deck for the typical 6×9 inch loudspeakers used in the aforementioned rear deck loudspeaker installation. These loudspeaker installations suffer the same problems as the small loudspeaker itself, natural boominess of the loudspeaker which creates heighten sound radiation in narrow ranges of frequencies and inefficiency at the low frequency end of the audio range.

A loudspeaker inside a small loudspeaker enclosure has also been mounted to the rear deck, door panels and under the dash of an automobile. Some of these loudspeaker enclosures have included ports in an attempt to recapture some of the backward moving waves from the loudspeaker. These loudspeaker enclosures have not been able to offer linear sound reproduction because the enclosures must be of a size significantly less than necessary to allow increased efficiency at the low frequency end of the audio spectrum. These loudspeaker enclosures are also plagued with boominess which is increased significantly because of the compression of the loudspeaker diaphragm due to incomplete damping of the backward moving wave of the loudspeaker in the small loudspeaker enclosure.

The applicant has invented loudspeaker assemblies which are adapted to be mounted in the majority of passenger cars or other places having a relatively small at least a partially enclosed space. The present loudspeaker assemblies provide significantly heightened linearity over the prior loudspeaker systems. They also allow the use of a bass loudspeaker larger than otherwise possible or practical in automobiles.

Figure 1:
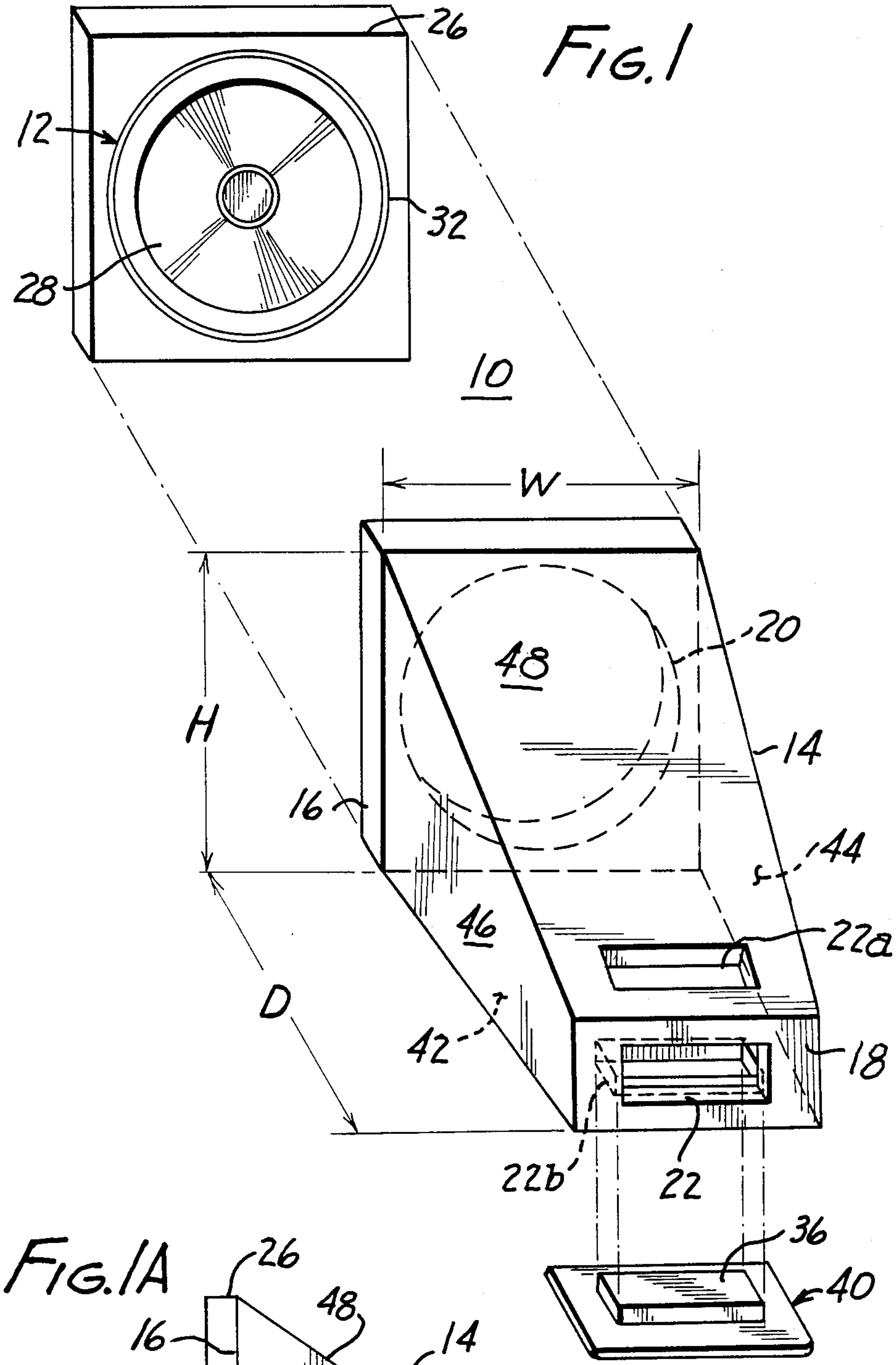
FIG. 1 is a perspective, exploded view of one embodiment of the loudspeaker assembly of the present invention.
Figure 1A:
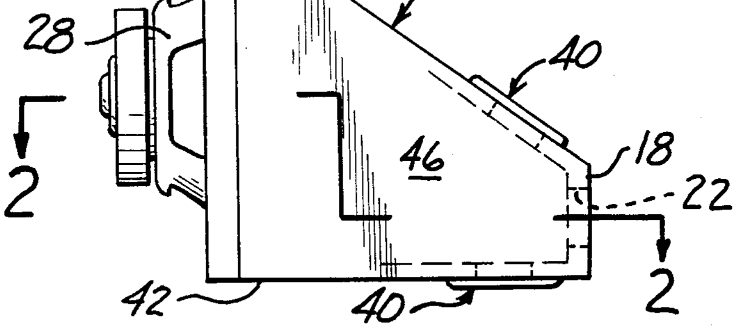
FIG. 1*a* is a side elevational view of the loudspeaker assembly.
Figure 2:
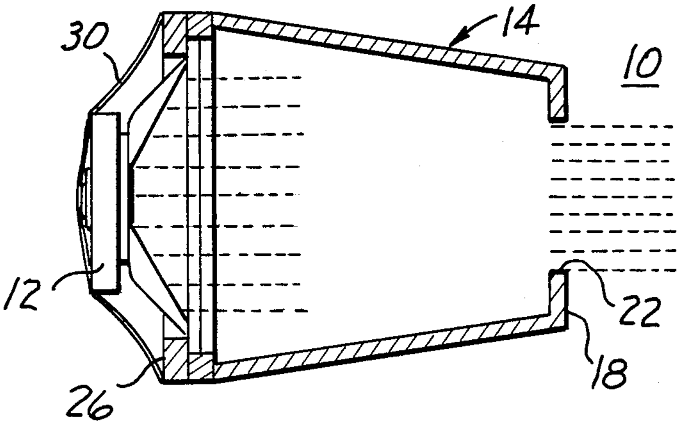
FIG. 2 is a sectional view of the loudspeaker assembly sliced along line 2—2 of FIG. 1*a;*

Referring to FIGS. 1 and 1*a*, the applicant has achieved this heightened linearity and adaptability by inventing, in one embodiment of his invention, a loudspeaker assembly 10 typically comprising a loudspeaker 12 or other sound emitting device and a tapered housing 14 having two ends 16 and 18. The end 16 is of greatest cross-sectional area and the end 18 is of least cross-sectional area with the end 16 defining a loudspeaker port 20 and the end 18 typically defining a sound port 22. The cross-sectional area of the sound port 22 is always less than the cross-sectional area of the loudspeaker port 20. The loudspeaker 12 is typically an 8 inch dynamic loudspeaker and is mounted to a mounting board 26 which, in turn, is mounted to the housing 14 to seal the front face 28 of the loudspeaker 12 to the housing 14 as shown in FIG. 2. The loudspeaker 12 fits snugly with the circular loudspeaker port 20 which has the same inner dimensions as the outer ring 32 of the loudspeaker 12. This snug fit allows a sealing of the loudspeaker 12 to the housing 14.

Referring to FIG. 2, the loudspeaker 12 is mounted on the outside of the housing 14 with the front face 28 of the loudspeaker 12 being in a sealed relationship to the housing 14 so that sound energy from the front face 28 is conducted into the housing and exits via the sound port 22. The rear extremities of the loudspeaker 12 may be covered with an open weave fabric 30 which is typically any of the fabrics used for grille cloths and acts to protect the loudspeaker 12 from damage. Since the loudspeaker port 20 has a larger cross-sectional area than the sound port 22, the sound exiting the sound port 22 is of greater pressure per square inch than found at the loudspeaker port 20 as indicated by the dotted horizontal lines indicating sound pressure. The increased sound pressure is caused by the sound meeting a decreasing volume through the housing 14.

Referring again to FIG. 1, the tapered housing 14 typically has four generally planar walls 42, 44, 46 and 48 assembled to give the housing 14 a rectangular cross section at the end 18 and a square cross section at the end 16. The walls 42, 44, 46 and 48 may be constructed of particle board or other dense material which is appropriate for reflecting sound energy. The sound port 22 may exist at 22*a* or 22*b* as shown instead of the typical location at end 18. It is typical for the housing 14 to have all ports 22, 22*a* and 22*b* cut out and the two unused ports sealed by a plug 40. The sound ports 22, 22*a* and 22*b* are typically of rectangular cross section and the plug 40 has a plug area 36 which snugly fits into any of the ports 22, 22*a* or 22*b* to prevent the port from conducting sound. Any one of these three sound ports 22, 22*a* and 22*b* may be used to conduct the sound energy from the loudspeaker 12.

The housing 14 may be of numerous tapered configurations and numerous dimensions, however, the dimensions found to be suitable for most passenger cars are as follows: height H is approximately 9.5 inches, width W is approximately 9.5 inches and depth D is approximately 9.5 inches. The loudspeaker, depending on its configuration and magnet size, generally adds from 3 to 4 inches to the depth D. The sound ports 22, 22*a* and 22*b* typically are rectangular with dimensions of 1.75 inches by 4 inches.

Figure 3A:
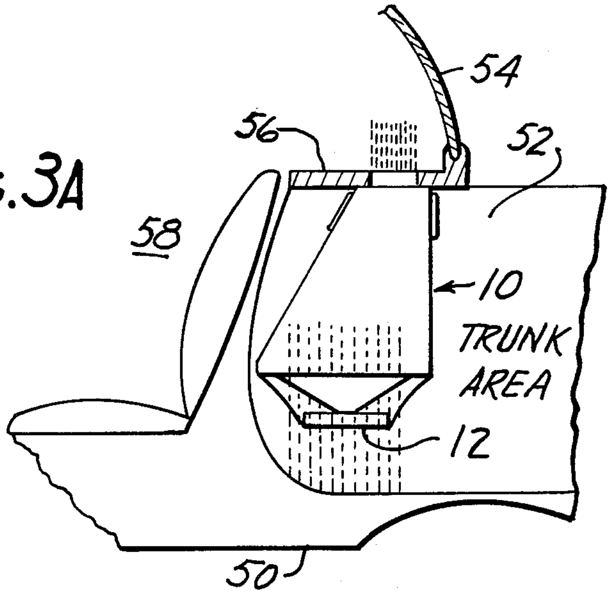
FIG. 3*a* is a cross-sectional view of an automobile showing the loudspeaker assembly mounted in the trunk area and sealed to the rear deck with the speaker directing upward.
Figure 3B:
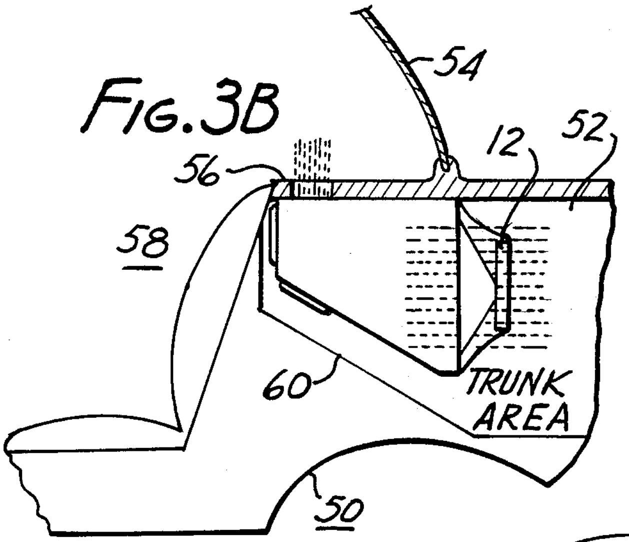
FIG. 3*b* is a cross-sectional view of an automobile showing the loudspeaker assembly mounted in the trunk area and sealed to the rear deck with the speaker directed frontward.
Figure 3C:
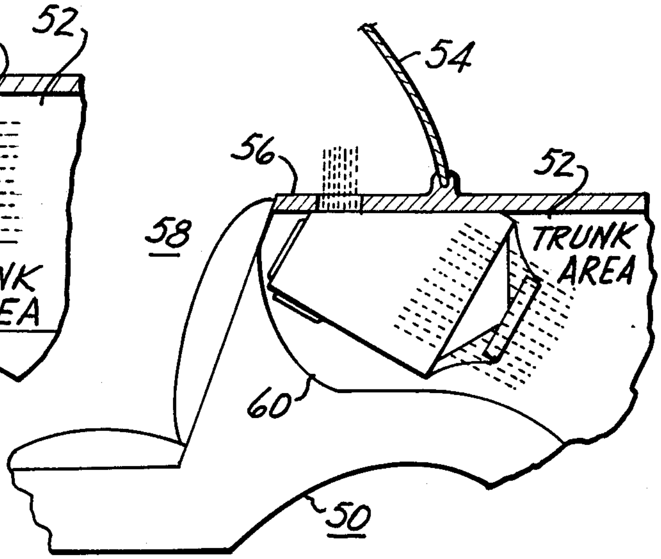
FIG. 3*c* is a cross-sectional view of an automobile showing the loudspeaker assembly mounted in the trunk area and sealed to the rear deck with the speaker directed upward.

Referring to FIGS. 3*a*, 3*b* and 3*c*, a side view of an automobile 50 is shown. A trunk area 52 and rear window area 54 are also shown. In FIG. 3*a*, the loudspeaker assembly 10 is shown mounted in the inner most part of the trunk area 52 with its sound port 22 emitting sound through a rear deck area 56. In some automobiles, this mounting configuration of the loudspeaker assembly 10 is best because there is sufficient room to mount the loudspeaker assembly's 10 entire depth D plus the loudspeaker 12 which is, as indicated above, between 12.5 and 13.5 inches depending on the configuration of the loudspeaker.

As can be seen, the trunk area 52 acts to approximate a true infinite baffle to the backward going wave from the loudspeaker 12 because the rug or covering typically found in the trunk area 52 plus the open space found therein will absorb the sound energy from the backward going wave. Thus, the backward going wave will not significantly interfere with the forward going wave which enters the passenger compartment 58.

In FIG. 3*b*, the sound port 22*b* is seen sealed to the rear deck 56. The trunk area 52 in this automobile 50 has a more pronounced inclined border 60 of the trunk area 52 which necessitates the use of the sound port 22*b* to take advantage of the configuration of the loudspeaker assembly 10 in this particular trunk area 52. In FIG. 3*c*, the sound port 22*a* is sealed to the rear deck 56. Here the configuration of the loudspeaker assembly 10 fits well with the rounded border 60 of the trunk area 52.

From the FIGS. 3*a*, 3*b* and 3*c*, it can be seen that the configuration of the loudspeaker assembly 10 as seen in FIG. 1 facilitates its mounting in numerous different types of trunk areas 52. In fact, the loudspeaker assembly 10 of FIG. 1 can be easily mounted in the trunk areas of most mass produced automobiles. However, the fact that the loudspeaker assembly 10 of FIG. 1 can be mounted in numerous trunk areas does not mean that it cannot be mounted in other compartments other than the passenger compartment of an automobile. It is possible, for example, that the loudspeaker assembly 10 of FIG. 1 can be mounted in the engine compartment or wheel wells.

Figure 4:
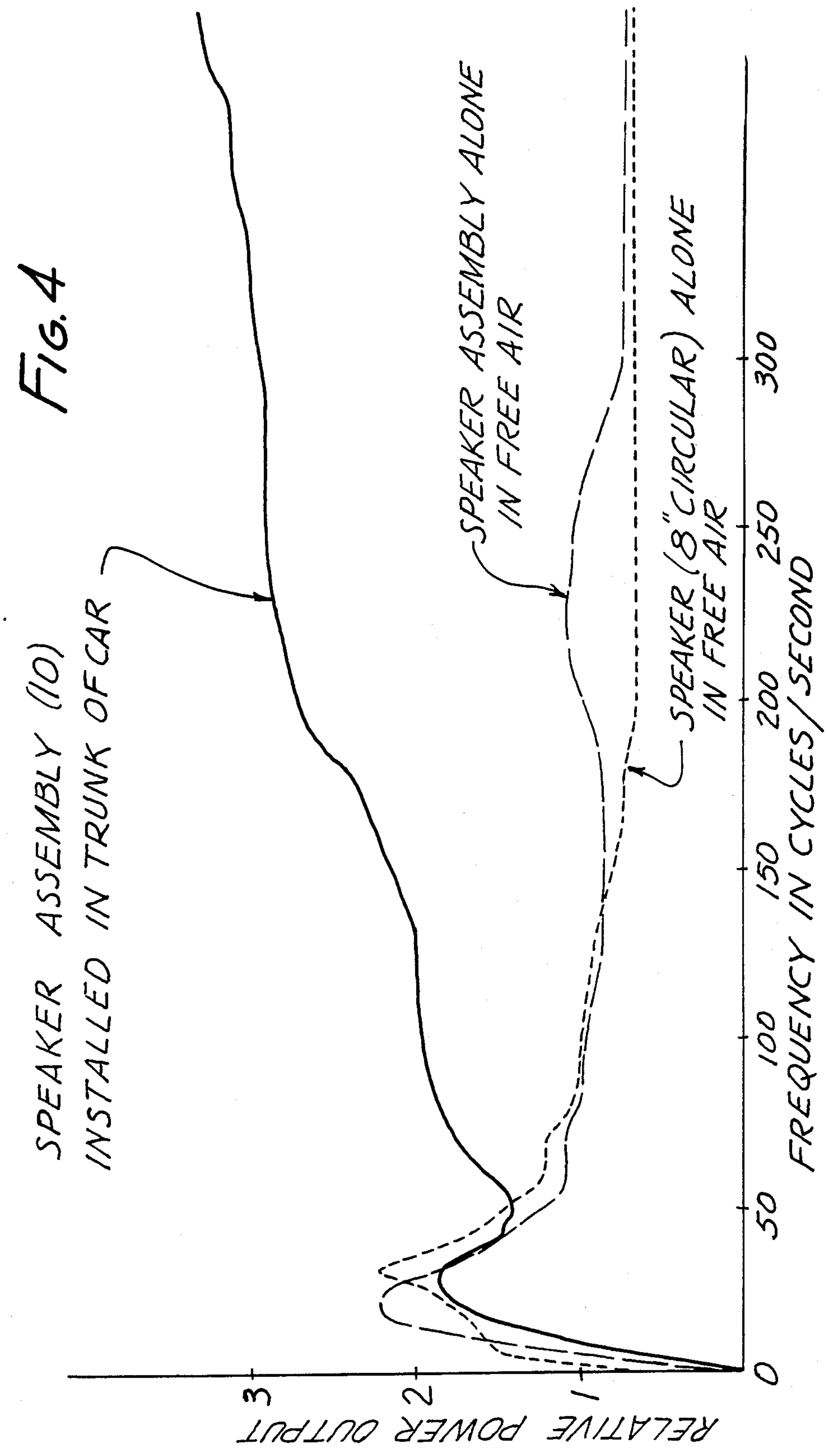
FIG. 4 is a graphical representation of the frequency response of a typical loudspeaker alone in free air, of the loudspeaker assembly, including a speaker alone in free air, and of the loudspeaker assembly of FIG. 1 mounted in the trunk of an automobile and emitting sound into the passenger compartment.

Referring now to FIG. 4, the frequency response of the loudspeaker 12 alone in free air, the loudspeaker assembly 10 alone in free air and the loudspeaker assembly 10 installed in the trunk of an automobile are seen. FIG. 4 shows the natural boominess in the frequency range between 0 and 50 cycles/second which is typical of a 8 inch circular dynamic loudspeaker. The loudspeaker whose frequency response is plotted in FIG. 4 is the same loudspeaker 12 used in the loudspeaker assembly 10.

FIG. 4 also shows the frequency response of the loudspeaker assembly 10 in free air by the short dashed line. As can be seen in the long dashed line graph representing the assembly 10 with the loudspeaker 12 in free air, the assembly 10 serves to round the severe peak and move it to a lower frequency of the response curve for the speaker 12 alone in free air. FIG. 4 also shows a plot of the frequency response of the loudspeaker assembly 10 installed in the trunk of a 1979 Ford Mustang coupe (continuous line) with the sound port 22 directed through the rear deck to the passenger compartment of the Mustang. Each measurement of frequency response in FIG. 4 was done in a conventional way by connecting an audio signal generator (not shown) to the loudspeaker 12 with a series resistance of 100 ohms (not shown) in the generator line and measuring the relative power output of the loudspeaker with an A.C. voltmeter (not shown) on the loudspeaker 12 side of the 100 ohm resistance.

FIG. 4 demonstrates that the installed loudspeaker assembly 10 almost eliminates the natural boominess of the loudspeaker 12 between 0 and 50 cycles/second and increases the loudspeaker's 12 efficiency at the low end of the audio spectrum, 0 to 400 cycles/second. Thus, a surprising elimination of boominess, an increase in efficiency at the low end of the audio frequencies and an increase in linearity of the frequency response in the low end of the audio frequencies has been accomplished with the installed loudspeaker assembly 10.

Figure 5:
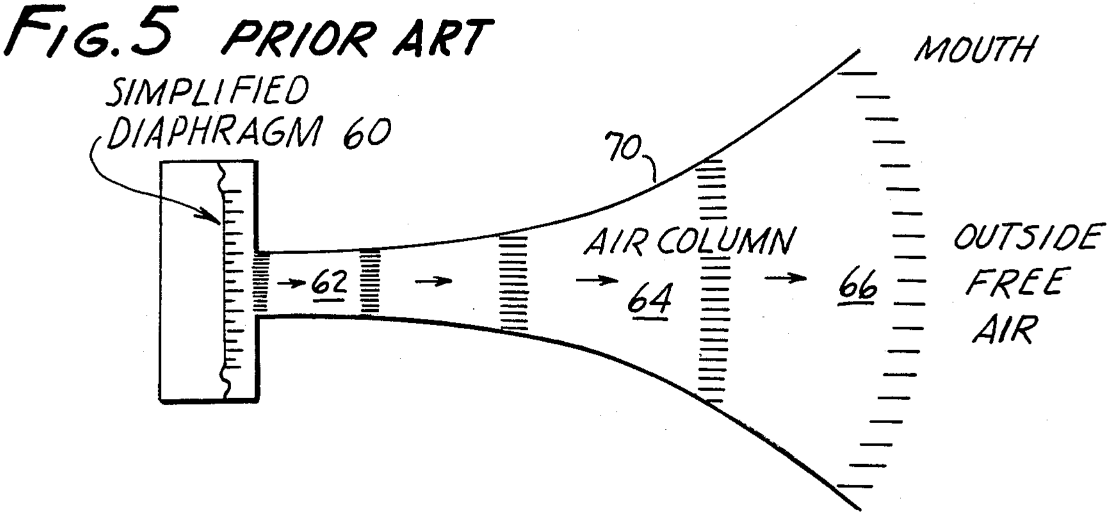
FIG. 5 PRIOR ART
FIG. 5 is a cross-sectional view of a horn type loudspeaker enclosure showing the decreasing pressure along the air column of this enclosure.
Figure 5A:
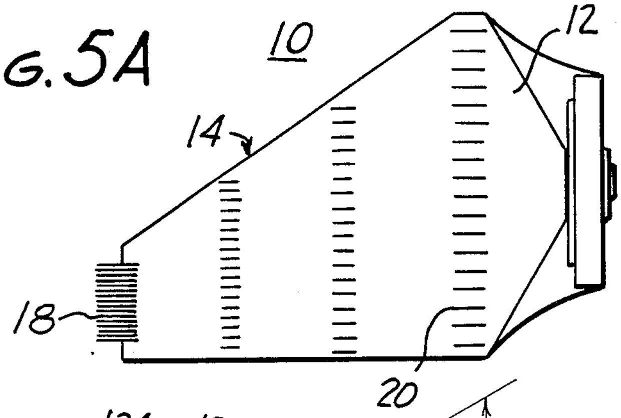
FIG. 5*a* is a side cross-sectional view of the loudspeaker assembly showing the compression of the sound pressure alone the tapered housing.

The surprising results obtained with the loudspeaker assembly 10 may be explained by a possible theory. Referring to FIGS. 5 and 5*a*, this possible theory will be explained.

As is known in the art of acoustics, the horn loudspeaker enclosure 70 is an acoustic transformer. The sound pressure created by the diaphragm 60, as indicated in the horizontal lines adjacent the diaphragm 60, is intensified in the throat area 62 because of the decreased volume. The sound pressure, as the sound travels through the air column 64, begins to decrease steadily until at the mouth area 66 the pressure is considerably less than at the throat area 62 or the diaphragm 60. Thus, the high pressure at the throat area 62 is transformed into low pressure at the mouth area 66 very much like the action of an electrical transformer on input and output electrical voltages.

The horn loudspeaker 70 creates exceptional power efficiency at the low end of the audio spectrum which may exceed 50 percent (the typical infinite baffle loudspeaker assembly alone has only about 10 percent power efficiency). (The aforementioned power efficiency is the relationship between actual acoustical power output to the actual electrical power input). This increase in efficiency at the low end of the audio spectrum happens because the radiating area of the diaphragm 60 is effectively increased at the mouth 66 so that the diaphragm 60 can now move larger volumes of air with the horn enclosure than it could alone.

This increase in power efficiency occurs because there are always large volumes of air to vibrate in an open air environment. In essence, the horn 70 transforms a high impedance sound energy from the diaphragm 60 into a low impedance sound energy at the mouth 66. Since the open air environments have low impedance air, the efficiency of the diaphragm 60 is increased by virtue of the acoustical transformer action of the horn 70. The open air environments have a low impedance to sound because the air motion from the loudspeaker is free to radiate outward unabated, hence, a low impedance media exists.

Referring to FIG. 5a, the loudspeaker assembly 10 is shown as the reverse of the horn 70 of FIG. 5. The loudspeaker 12 is equivalent to the diaphragm 60 of FIG. 5 and provides relatively low pressure sound energy at the loudspeaker port 20. This relatively low pressure sound energy is transformed into high pressure sound energy at the sound port 18 because of the decreasing volume of the tapered housing 14 at the sound port 22.

It is theorized that the enclosed air environment of the passenger compartment of an automobile is at a high impedance relative to free air. Assuming this to be so, the loudspeaker assembly 10 of the present invention provides increased efficiency at the low end of the audio spectrum by transforming the relatively low impedance of the loudspeaker 12 to the high impedance of the passenger compartment air; thus, the impedance matching with consequent power efficiency of the loudspeaker assembly 10 is greater than has previously been achieved in a passenger compartment or other small enclosed area.

It is theorized that unlike free air environments, a small enclosed air environment requires a greater sound pressure to overcome the high impedance of the air caused by the enclosing of the air by the walls of the passenger compartment. Because the air enclosed by the compartment walls is not free to move outward like it is in a free air environment, a higher sound pressure is required to effectively vibrate the enclosed air relative to free air. If this theory holds true, about the only way to effectively radiate low frequency sound energy in an enclosed passenger compartment with the typical speaker 12 which has a low impedance to air, is to transform this low impedance to high impedance via a reverse horn type loudspeaker assembly 10.

The high and middle ranges of audio frequencies have no problem being radiated in an open or enclosed air environment so that no special treatment of these ranges is important except that a linear frequency response from the entire loudspeaker assembly 10 is the desired goal.

Even without considering the aforementioned theory, the results plotted in FIG. 4 clearly demonstrate that a dramatic gain in efficiency at the low end of the audio frequencies, a dramatic increase in linearity of the frequency response in the low end of the audio frequencies and a virtual elimination of the natural boominess of the loudspeaker 12 has been accomplished with the installed loudspeaker assembly 10. However, the aforementioned theory is supported by the data found in FIG. 4.

As can be seen, when the loudspeaker assembly 10 is operated in free air, it changes to some extent the characteristics of the low end of the audio spectrum over the speaker 12 alone in free air; however, as seen in FIG. 4, when the loudspeaker assembly 10 is installed and directing sound energy into the enclosed air of a passenger compartment, there is a dramatic rise in the efficiency and linearity of the low end of the audio spectrum. If the aforementioned theory is correct, it is a good explanation for the surprising results accomplished by the loudspeaker assembly 10.

Figure 6:
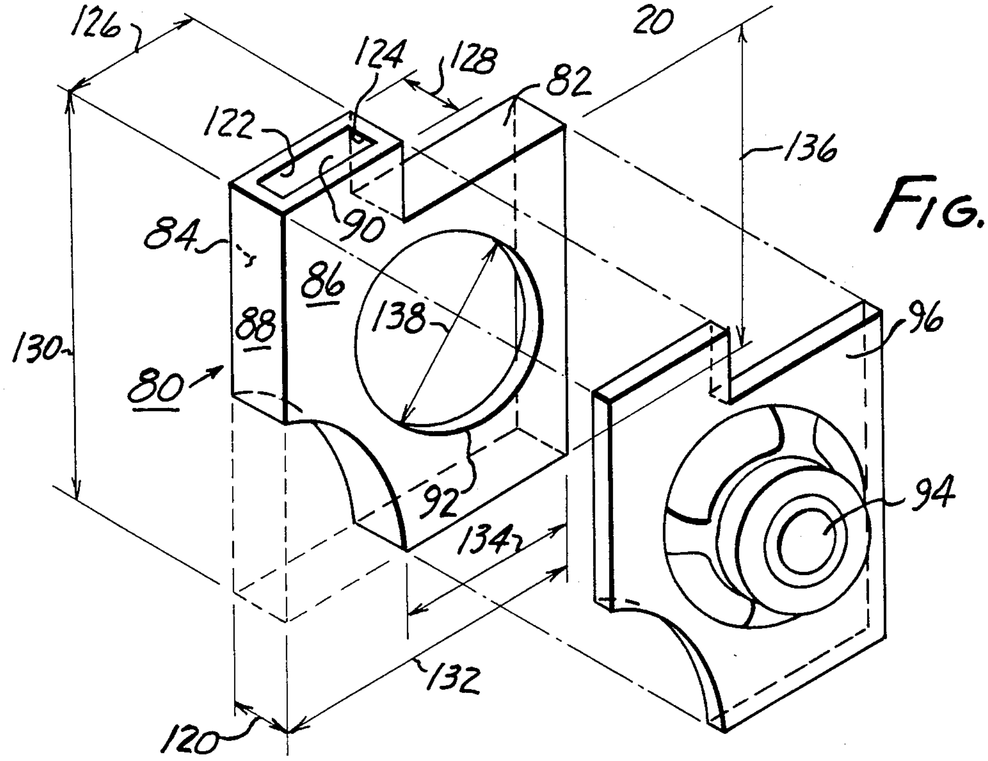
FIG. 6 is an exploded perspective view of another embodiment of the loudspeaker assembly of this invention.

Referring now to FIG. 6, another embodiment of the present invention is seen. The housing 82 of this loudspeaker assembly 80 is a generally rectangular housing 82 composed of two separated but generally co-planar sidewalls 84 and 86 separated by a generally perpendicular connecting wall 88 which connect the sidewalls 84 and 86 at their peripheral edges and create an enclosed housing 82.

The sidewalls 84 and 86 and the connecting wall 88 may be made of particle board or other dense material appropriate for reflecting sound energy. The sidewalls 84 and 86 and the connecting wall 88 define an extended sound port 90 which is typically rectangular in cross section. A loudspeaker port 92 is typically defined by one of the sidewalls 86 and is generally circular in cross section to accommodate the loudspeaker 94 which is attached to a mounting board 96. The loudspeaker 94 is also typically an 8 inch dynamic loudspeaker similar to loudspeaker 12 of FIG. 1. As can be seen, it is typical for the sound port 90 to be in perpendicular planar relation to the loudspeaker port 92 in this embodiment of the loudspeaker assembly 80.

The mounting board 96 and the housing 82, when attached, create a sealed relationship between the loudspeaker 94 and the loudspeaker port 92. The sound energy from the loudspeaker 94 which enters the housing 82 is conducted through the sound port 90. Since the loudspeaker port 92 is always larger in area than the sound port 90, similar to the loudspeaker assembly 10 of FIG. 1, there is an increased sound pressure condition at the sound port 90 relative to the loudspeaker port 92. Therefore, this loudspeaker assembly 80 demonstrates similar advantages as already described for the loudspeaker assembly 10 of FIG. 1.

Typical dimensions of the loudspeaker assembly 80 which have been found to be satisfactory are the following: the connecting wall 88 has a height 120 of 4.4 inches; the sound port 90 has a dimension of 4 inches for inner wall 122 and 3 inches for inner wall 124, the outer dimensions of the sound port 90 are 5.5 inches wide at 126 by 4.4 inches at 128; the overall height 130 including the sound port 90 of the housing 82 is 14.5 inches; the overall width 132 of the housing 82 including the sound port 90 is 11.25 inches; the width 134 of the housing 82 without the sound port 90 is 9.5 inches; the height 136 of the housing 82 without the sound port is 12 inches; and, of course, the loudspeaker port 92 has a diameter 138 of approximately 8.5 inches to accommodate the 8 inch loudspeaker 94 in a snug fitting and sealed relation. These dimensions, of course, are only illustrative and are not to be considered limiting since the dimensions of the loudspeaker assembly 80 may be changed and still be consistent with the present invention.

Figure 7:
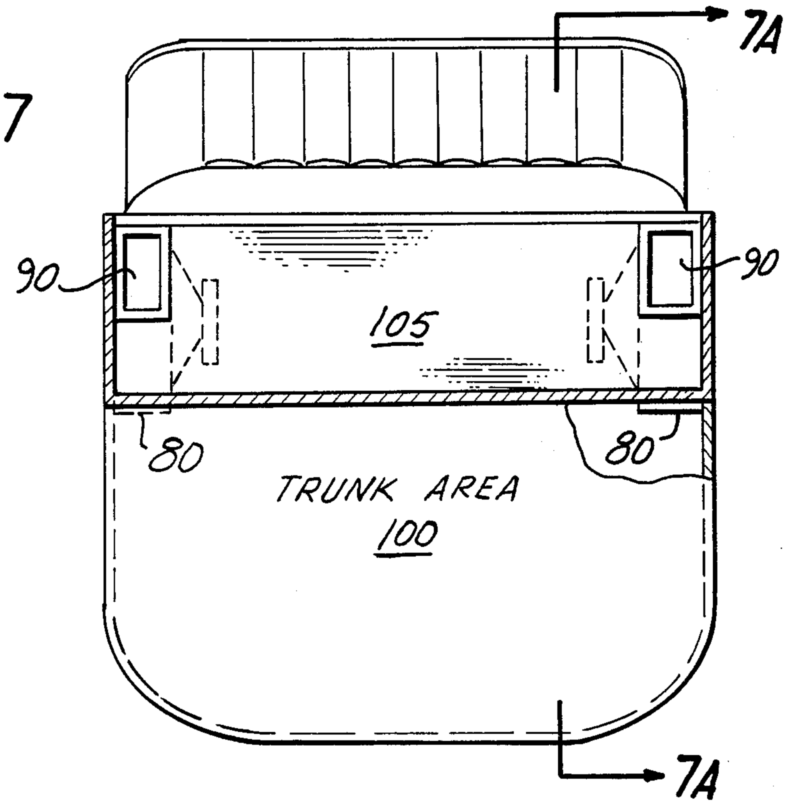
FIG. 7 is a horizontal cross-sectional view of the trunk area of an automobile showing the loudspeaker assembly mounted at each of the two front corners of the trunk area; and, FIG. 7*a* is a vertical cross-sectional view, along line 7*a*—7*a* of FIG. 7, of an automobile showing the loudspeaker assembly sealed to the rear deck and emitting sound into the passenger compartment.
Figure 7A:
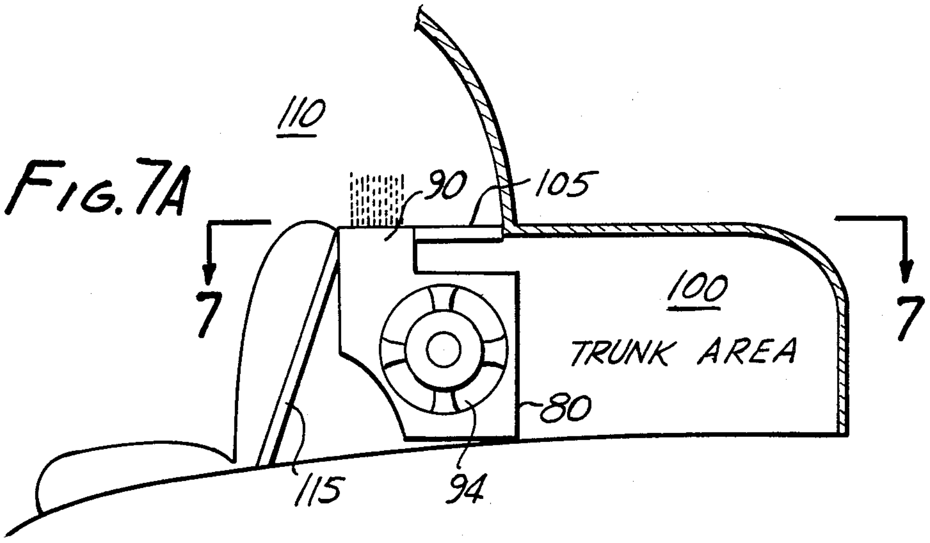

Referring to FIGS. 7 and 7*a,* the loudspeaker assembly 80 is especially suited for installation in the trunk of the Mecedes Benz model 300D sedan manufactured between 1979 and 1982. As shown in FIG. 7, typically two loudspeaker assemblies 80 are installed at the two front corners of the trunk area 100. An area of the rear deck 105 is cut to receive the sound port 90 in a sealed relation to the rear deck 105. As can be seen in FIG. 7*a,* the sound energy emitted from the sound port 90 enters the passenger compartment 110. Thus, a very small amount of room is taken up by the loudspeaker assembly 80 and the advantages of the high pressure sound previously described are also present.

The loudspeaker assembly 80 has the same feature of increasing sound pressure at the sound port 90 as the loudspeaker assembly 10 of FIG. 1. Thus the loudspeaker assembly 80 acts to demonstrate that numerous configurations may be made in which the loudspeaker port 92 has a larger cross-sectional area than the sound port 90 and still retain the aforementioned advantages of the acoustical transformer action of the present invention.

The above described embodiments are illustrative in nature and are not to be considered limiting. Instead the scope of the present invention shall be determined by the scope of the following claims plus their equivalents.

I claim:

1. A loudspeaker assembly comprising:

a loudspeaker; and, an enclosed housing having an area defining a loudspeaker port and an area defining at least one sound port, the loudspeaker port being adapted to mount the loudspeaker substantially outside of the housing in a sealed relationship to the front of the housing, the loudspeaker directing sound into the housing, and the sound port having a cross-sectional area less than the cross-sectional area of the loudspeaker port so that the pressure of the second energy emitted at the loudspeaker becomes increased when emitted through at least one of the sound ports;

wherein the sound port is in substantially sealed relationship to an at least partially enclosed space so that sound energy passed through the sound port enters the at least partially enclosed space; and wherein the housing comprises an enclosed tapered housing having two ends, one end of greater cross-sectional area and the other end of lesser cross-sectional area, the end of greater cross-sectional area having an area defining the loudspeaker port and the end of lesser cross-sectional area having an area defining one of the at least one sound port; and wherein the housing comprises four walls defining a rectangular cross section at the end of lesser cross-sectional area and a square cross section at the end of greater cross-sectional area, whereby the wall of greater cross-sectional area is adapted to receive a circular loudspeaker and said wall of lesser cross-sectional area is adapted to channel sound through an elongated opening.

2. The loudspeaker assembly in accordance with claim 1 in which the sound port is co-planar with the loudspeaker port.

3. The loudspeaker assembly in accordance with claim 1 or 2 in which the sound port is of rectangular cross section.

4. The loudspeaker assembly in accordance with claim 1 in which the at least partially enclosed space is an automobile passenger compartment and the loudspeaker assembly is mounted in an automobile compartment other than the passenger compartment, the sound port being in a sealed relationship to an inner wall of the passenger compartment so that sound from the loudspeaker received by the housing enters the automobile passenger compartment from the sound port and through the inner wall of the passenger compartment.

5. The loudspeaker assembly in accordance with claim 4 in which the automobile compartment other than the passenger compartment comprises the automobile trunk and the inner wall of the passenger compartment comprises the automobile rear deck, the sound port of the loudspeaker assembly being mounted to and in a sealed relationship to the under side of the rear deck.

6. A loud speaker assembly comprising:

A loud speaker; and, an enclosed housing having an area defining a loud speaker port and an area defining at least one sound port, a loud speaker port being adapted to mount the loud speaker substantially outside of the housing in a sealed relationship to the front of the housing, the loud speaker directing sound into the housing, the sound port having a cross-sectional area less than the cross-sectional area of the loud speaker port so that the pressure of the sound energy emitted at the loud speaker becomes increased when emitted through at least one of the sound ports;

in which the housing comprises an enclosed tapered housing having two ends, one end of greater cross-sectional area and the other end of lesser cross-sectional area, the end of greater cross-sectional area having an area defining the loud speaker port and the end of lesser cross-sectional area having an area defining at least one sound port;

in which the housing comprises four walls defining a rectangular cross-section at the end of lesser cross-sectional area and a square cross-section at the end of greater cross-sectional area is adapted to receive a circular loud speaker and said wall of lesser cross-sectional area is adapted to channel sound through a elongated opening;

in which the at least partially enclosed space is a automobile passenger compartment and the loud speaker assembly is mounted in an automobile compartment other that than the passenger compartment, the sound port being in a sealed relationship to an inner wall of the passenger compartment so that sound from the loud speaker received by the housing enters the automobile passenger compartment from the sound port and through the inner wall of the passenger compartment;

in which the automobile compartment other than the passenger compartment comprises the automobile trunk and the inner wall of the passenger compartment comprises the automobile rear deck, the sound port of the loud speaker assembly being mounted to and in sealed relationship to the underside of the rear deck;

in which the at least one sound port comprises a plurality of sound ports, said sound ports except for one being located on opposite walls of the four walls of the housing and are adjacent the end of lesser cross-sectional area, the said one sound port being located in the end of lesser cross-sectional area, and, all of said sound ports except one being blocked from conducting sound energy by a plurality of closure members, each closure member being adapted to be inserted into the one of said sound ports whereby all but one of said sound ports are substantially sealed against conducting sound.

7. The loudspeaker assembly in accordance with claim 6 in which the plurality of sound ports is three sound ports and the sound port without the inserted closure member is mounted in sealed relation to the rear deck of the automobile to conduct sound into the passenger compartment, whereby three different positions of the housing may be used in mounting the loudspeaker assembly to the rear deck.

8. A loudspeaker assembly comprising:

a loudspeaker; and, an enclosed housing having an area defining a loudspeaker port and an area defining at least one sound port, the loudspeaker port being adapted to mount the loudspeaker substantially outside of the housing in a sealed relationship to the front of the housing, the loudspeaker directing sound into the housing, and the second port having a cross-sectional area less than the cross-sectional area of the loudspeaker port so that the pressure of the sound energy emitted at the loudspeaker becomes increased when emitted through at least one of the sound ports;

wherein the sound port is in substantially sealed relationship to an at least partially enclosed space so that sound energy passed through the sound port enters the at least partially enclosed space;

in which the housing comprises a generally rectangular box having two co-planar sidewalls separated by perpendicular connecting walls attached generally at the peripheral edges of the two sidewalls, and the two sidewalls and the connecting walls also defining an extended hollow neck portion of generally rectangular cross section comprising the sound port.

9. The loudspeaker assembly in accordance with claim 8 in which the one of the two sidewalls has an area defining the loudspeaker port.

10. The loudspeaker assembly in accordance with claim 9 in which the loudspeaker port is circular in cross section and is adapted to receive from outside the loudspeaker assembly a circular loudspeaker in a sealed relation to the housing.

11. The loudspeaker assembly in accordance with claim 9 in which the loudspeaker port is generally in perpendicular planar relation to the sound port.

12. The loudspeaker assembly in accordance with claim 8 in which the loudspeaker assembly is adapted to be mounted in an automobile compartment other than the passenger compartment, the sound port being in a sealed relationship to an inner wall of the passenger compartment so that sound from the loudspeaker received by the housing enters the automobile passenger compartment from the sound port through the inner wall of the passenger compartment.

13. The loudspeaker assembly in accordance with claim 12 in which the automobile compartment other than the passenger compartment is the automobile trunk and the inner wall of the passenger compartment is the rear deck, the sound port of the loudspeaker assembly being mounted to and in a sealed relationship to the under side of the rear deck.

14. An accoustic assembly adapted to receive a loudspeaker comprising:

an enclosed housing having an area defining a loudspeaker port and an area defining at least one sound port, the loudspeaker port being adapted to mount the loudspeaker substantially outside of the housing in a sealed relationship to the front of the housing, the loudspeaker directing sound into the housing, and each of the sound ports having a cross-sectional area less than the cross-sectional area of the loudspeaker port so that the pressure of the sound energy emitted at the loudspeaker becomes increased when emitted through at least one of the sound ports;

wherein the sound port is in substantially sealed relationship to an at least partially enclosed space so that sound energy passed through the sound port enters the at least partially enclosed space;

wherein the housing comprises an enclosed tapered housing having two ends, one end of greater cross-sectional area and the other end of lesser cross-sectional area, the end of greater cross-sectional area having an area defining the loudspeaker port and the end of lesser cross-sectional area having an area defining one of the at least one sound port;

in which the housing comprises four walls defining a rectangular cross section at the end of lesser cross-sectional area and a square cross section at the end of greater cross-sectional area, whereby the wall of greater cross-sectional area is adapted to receive a circular loudspeaker and said wall of lesser cross-sectional area is adapted to channel sound through an elongated opening.

15. The accoustic assembly in accordance with claim 14 in which the sound port is co-planar with the loudspeaker port.

16. The accoustic assembly in accordance with claim 14 or 15 in which the sound port is of rectangular cross section.

17. The accoustic assembly in accordance with claim 14 in which the at least partially enclosed space is an automobile passenger compartment and the accoustic assembly is mounted in an automobile compartment other than the passenger compartment, the sound port being in a sealed relationship to an inner wall of the passenger compartment so that sound from the loudspeaker received by the housing enters the automobile passenger compartment from the sound port and through the inner wall of the passenger compartment.

18. The accoustic assembly in accordance with claim 17 in which the automobile compartment other than the passenger compartment comprises the automobile trunk and the inner wall of the passenger compartment comprises the automobile rear deck, the sound port of the accoustic assembly being mounted to and in a sealed relationship to the under side of the rear deck.

19. An acoustic assembly adapted to receive a loud speaker comprising:

an enclosed housing having an area defining a loud speaker port and an area defining at least one sound port, the loud speaker port being adapted to mount the loud speaker substantially outside of the housing in a sealed relationship to the front of the housing, the loud speaker directing sound into the housing, and, the sound port having a cross-sectional area less than the cross-sectional area of the loud speaker port so that the pressure of the sound energy emitted at the loud speaker becomes increased when emitted through at least one of the sound ports;

in which the sound port is in substantially sealed relationship to an at least in partly enclosed space so that sound energy passed through the sound port enters the at least partially enclosed space;

in which the housing comprises an enclosed tapered housing having two ends, one end of greater cross-sectional area and the other end of lesser cross-sectional area, the end of greater cross-sectional area having an area defining the loud speaker port and the end of lesser cross-sectional area having an area defining at least one sound port;

in which the housing comprises four walls defining a rectangular cross-section at the end of lesser cross-sectional area an an square cross-section at the end of greater cross-sectional area, whereby the wall of greater cross-sectional area is adapted to receive a circular loud speaker and said wall of lesser cross-sectional area is adapted to channel sound through a elongated opening;

in which the at least partially enclosed space is an automobile passenger compartment and the acoustic assembly is mounted in an automobile compartment other than the passenger compartment, the sound port being in a sealed relationship to an inner wall of the passenger compartment so that sound from the loud speaker received by the housing enters the automobile passenger compartment from the sound port and through the inner wall of the passenger compartment;

in which the automobile compartment other than the passenger compartment comprises the automobile trunk and the inner wall of the passenger compartment comprises the automobile rear deck, the sound port of the acoustic assembly being mounted to and in sealed relationship to the underside of the rear deck;

in which the at least one sound port comprises a plurality of sound ports, said sound ports except for one being located opposite wall of the four walls of the housing and are adjacent the end of lesser cross-sectional area, the said one sound port being located in end of lesser cross-sectional area, and, all of said sound ports except one being blocked from conducting sound energy by a plurality of closure members, each closure member being adapted to be inserted into the one of said sound ports whereby all but one of said sound ports are substantially sealed against conducting sound.

20. The accoustic assembly in accordance with claim 19 in which the plurality of sound ports is three sound ports and the sound port without the inserted closure member is mounted in sealed relation to the rear deck of the automobile to conduct sound into the passenger compartment, whereby three different positions of the housing may be used in mounting the accoustic assembly to the rear deck.

21. The accoustic assembly in accordance with claim 14 in which the housing comprises a generally rectangular box having two co-planar sidewalls separated by perpendicular connecting walls attached generally at the peripheral edges of the two sidewalls, the two sidewalls and the connecting walls also defining an extended hollow neck portion of generally rectangular cross section comprising the sound port.

22. The accoustic assembly in accordance with claim 21 in which one of the two sidewalls has an area defining the loudspeaker port.

23. The accoustic assembly in accordance with claim 22 in which the loudspeaker port is circular in cross section and is adapted to receive from outside the acoustic assembly a circular loudspeaker in a sealed relation to the housing.

24. The accoustic assembly in accordance with claim 22 in which the loudspeaker port is generally in perpendicular planar relation to the sound port.

25. The accoustic assembly in accordance with claim 21 in which the accoustic assembly is adapted to be mounted in an automobile compartment other than the passenger compartment, the sound port being in a sealed relationship to an inner wall of the passenger compartment so that sound from the loudspeaker received by the housing enters the automobile passenger compartment from the sound port through the inner wall of the passenger compartment.

26. The accoustic assembly in accordance with claim 25 in which the automobile compartment other than the passenger compartment is the automobile trunk and the inner wall of the passenger compartment is the rear deck, the sound port of the accoustic assembly being mounted to and in a sealed relationship to the under side of the rear deck.

* * * * *